(12) United States Patent
Xiong et al.

(10) Patent No.: US 11,923,773 B2
(45) Date of Patent: Mar. 5, 2024

(54) VOLTAGE REGULATOR MODULE

(71) Applicant: Delta Electronics, Inc., Taoyuan (TW)

(72) Inventors: Yahong Xiong, Taoyuan (TW); Shaojun Chen, Taoyuan (TW); Da Jin, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 286 days.

(21) Appl. No.: 17/530,790

(22) Filed: Nov. 19, 2021

(65) Prior Publication Data

US 2022/0078916 A1 Mar. 10, 2022

Related U.S. Application Data

(63) Continuation of application No. 16/810,406, filed on Mar. 5, 2020, now Pat. No. 11,212,919.

(30) Foreign Application Priority Data

Mar. 18, 2019 (CN) .......................... 201910205050.6

(51) Int. Cl.
  *H05K 1/11* (2006.01)
  *H02M 3/158* (2006.01)
  (Continued)

(52) U.S. Cl.
  CPC ............ *H02M 3/158* (2013.01); *H05K 1/115* (2013.01); *H05K 1/181* (2013.01); *H05K 1/185* (2013.01);
  (Continued)

(58) Field of Classification Search
  CPC ........ H05K 1/115; H05K 1/181; H05K 1/185; H05K 5/0247; H05K 5/065; H02M 1/0048
  (Continued)

(56) References Cited

U.S. PATENT DOCUMENTS 8,094,458 B2   1/2012   Furnival
8,427,269 B1   4/2013   Vinciarelli et al.
(Continued)

FOREIGN PATENT DOCUMENTS

CN     1378415 A     11/2002
CN     2629393 Y     7/2004
(Continued)

*Primary Examiner* — Andargie M Aychillhum
(74) *Attorney, Agent, or Firm* — KIRTON McCONKIE; Evan R. Witt

(57) ABSTRACT

A voltage regulator module is provided. The switch circuit assembly includes two switch circuits and an input capacitor. Respective input terminals of the two switch circuits are connected with each other in parallel. The input capacitor is electrically connected with the respective input terminals of the two switch circuits in parallel and disposed between the two switch circuits. The plurality of conductive members have a first conductive member, a second conductive member and a third conductive member. The first conductive member and the third conductive member are configured to deliver an electric energy. The second conductive member is configured to deliver a signal. One end of each conductive member is electrically connected with corresponding switch circuit, and the other end of the first conductive member and the third conductive member is electrically connected with the load. The switch circuit assembly and the magnetic assembly are stacked with each other.

22 Claims, 15 Drawing Sheets

(51) Int. Cl.
*H05K 1/18* (2006.01)
*H05K 5/02* (2006.01)
*H05K 5/06* (2006.01)
*H02M 1/00* (2006.01)
*H02M 3/00* (2006.01)

(52) U.S. Cl.
CPC ........... *H05K 5/0247* (2013.01); *H05K 5/065* (2013.01); *H02M 1/0048* (2021.05); *H02M 3/003* (2021.05); *H05K 2201/1003* (2013.01); *H05K 2201/10166* (2013.01); *H05K 2201/1031* (2013.01); *H05K 2201/10522* (2013.01)

(58) Field of Classification Search
USPC .......................................................... 361/761
See application file for complete search history.

(56) References Cited

U.S. PATENT DOCUMENTS

| | | | |
|---|---|---|---|
| 8,966,747 | B2 | 3/2015 | Vinciarelli et al. |
| 9,387,633 | B1 | 7/2016 | Vinciarelli et al. |
| 9,516,761 | B2 | 12/2016 | Vinciarelli et al. |
| 9,936,580 | B1 | 4/2018 | Vinciarelli et al. |
| 10,264,664 | B1 | 4/2019 | Vinciarelli et al. |
| 2011/0273257 | A1 | 11/2011 | Ishizawa |
| 2012/0091815 | A1* | 4/2012 | Richards, III .......... H02M 1/32 307/80 |
| 2014/0313003 | A1 | 10/2014 | Liu et al. |
| 2015/0062989 | A1 | 3/2015 | Su et al. |
| 2015/0282370 | A1 | 10/2015 | Yang et al. |
| 2015/0302974 | A1 | 10/2015 | Zhao et al. |
| 2016/0049235 | A1 | 2/2016 | Parish et al. |
| 2016/0049236 | A1 | 2/2016 | Kneller et al. |
| 2016/0268034 | A1 | 9/2016 | Subat et al. |
| 2016/0302312 | A1 | 10/2016 | Vinciarelli et al. |
| 2018/0122562 | A1 | 5/2018 | Ji et al. |
| 2019/0115308 | A1* | 4/2019 | Dayringer ............. H01L 23/645 |
| 2019/0311839 | A1 | 10/2019 | Rump et al. |

FOREIGN PATENT DOCUMENTS

| | | |
|---|---|---|
| CN | 101996759 A | 3/2011 |
| CN | 201936720 U | 8/2011 |
| CN | 102360787 A | 2/2012 |
| CN | 103475226 A | 12/2013 |
| CN | 103956250 A | 7/2014 |
| CN | 106533179 A | 3/2017 |
| CN | 107437885 A | 12/2017 |
| CN | 108022917 A | 5/2018 |
| CN | 110139477 A | 8/2019 |
| CN | 209448994 U | 9/2019 |
| GB | 2471497 A | 1/2011 |
| JP | 2009177019 A | 8/2009 |
| WO | 2014206460 A1 | 12/2014 |

\* cited by examiner

VOLTAGE REGULATOR MODULE

CROSS-REFERENCE TO RELATED APPLICATION

This application is a Continuation Application of U.S. patent application Ser. No. 16/810,406 filed on Mar. 5, 2020 and entitled "VOLTAGE REGULATOR MODULE", which claims priority to China patent application No. 201910205050.6 filed on Mar. 18, 2019. The entireties of the above-mentioned patent applications are incorporated herein by reference for all purposes.

FIELD OF THE INVENTION

The present disclosure relates to a voltage regulator module, and more particularly to a voltage regulator module with reduced volume.

BACKGROUND OF THE INVENTION

Please refer to FIGS. 1A and 1B. FIG. 1A schematically illustrates the structure of a conventional electronic device. FIG. 1B schematically illustrates the structure of a voltage regulator module of the electronic device as shown in FIG. 1A. As shown in FIGS. 1A and 1B, the electronic device 1 has a horizontal layout structure. The electronic device 1 includes a central processing unit (CPU) 11, a voltage regulator module 12, a system board 13 and an output capacitor 14. The voltage regulator module 12 is used for converting an input voltage into a regulated voltage and providing the regulated voltage to the central processing unit 11. The system board 13 has a first surface and a second surface, which are opposed to each other. The voltage regulator module 12 and the central processing unit 11 are disposed on the first surface of the system board 13. For meeting the load dynamic switching requirements, the output terminal of the voltage regulator module 12 is located near the input terminal of the central processing unit 11. The output capacitor 14 is disposed on the second surface of the system board 13. The output capacitor 14 is located beside the input terminal of the central processing unit 11.

The voltage regulator module 12 further includes a printed circuit board 15 and a magnetic element 16. The magnetic element 16 is disposed on the printed circuit board 15. Moreover, a switch element is disposed in a vacant space between the printed circuit board 15 and the magnetic element 16. The printed circuit board 15 is disposed on the first surface of the system board 13. The heat from the voltage regulator module 12 can be transferred to the system board 13 through the printed circuit board 15. Moreover, the heat is dissipated away through a heat dissipation mechanism (not shown) of the system board 13.

Recently, the required current for the central processing unit 11 is gradually increased. In addition, the trend of the volume of the electronic device is toward miniaturization. Since the central processing unit 11 and the voltage regulator module 12 are located at the same side of the system board 13, the electronic device cannot meet the load dynamic switching requirements.

For reducing the volume of the electronic device and effectively enhancing the dynamic switching performance of the voltage regulator module, another electronic device is disclosed. FIG. 2 schematically illustrates the structure of another conventional electronic device. The electronic device 1' of FIG. 2 has the vertical layout structure. The voltage regulator module 12 is disposed on the second surface of the system board 13, so that the voltage regulator module 12 and the central processing unit 11 are disposed on opposed surfaces of the system board 13. Consequently, the volume of the electronic device 1' is effectively reduced. Moreover, since the output capacitor (not shown) is located near the output terminal of the voltage regulator module 12 and the input terminal of the central processing unit 11, the dynamic switching performance of the voltage regulator module 12 is enhanced.

Although the dynamic switching performance of the voltage regulator module of the electronic device 1' as shown in FIG. 2 is enhanced, there are still some drawbacks. For example, since the magnetic element 16 and the switch element of the voltage regulator module 12 are disposed on the same side of the printed circuit board 15 and the switch element is disposed in the vacant space between the printed circuit board 15 and the magnetic element 16, it is difficult to optimize the structure and the size of the magnetic element 16 of the voltage regulator module 12. In other words, the size of the voltage regulator module 12 in the electronic device 1' is still large. Moreover, when the voltage regulator module 12 on the system board 13 undergoes a reflow soldering process, the inner components to be reheated are possibly detached or shifted.

Therefore, there is a need of providing an improved voltage regulator module in order to overcome the drawbacks of the conventional technologies.

SUMMARY OF THE INVENTION

An object of the present disclosure provides a voltage regulator module with reduced size.

Another object of the present disclosure provides a voltage regulator module that is manufactured by a simplified fabricating process.

In accordance with an aspect of the present disclosure, a voltage regulator module is provided. The voltage regulator module powers a load and includes a switch circuit assembly and a magnetic assembly. The switch circuit assembly includes two switch circuits and an input capacitor. Respective input terminals of the two switch circuits are connected with each other in parallel. The input capacitor is electrically connected with the respective input terminals of the two switch circuits in parallel and disposed between the two switch circuits. The magnetic assembly includes a core assembly and a plurality of conductive members. The plurality of conductive members have at least one first conductive member, at least one second conductive member and at least one third conductive member. The at least one first conductive member and the at least one third conductive member are configured to deliver an electric energy. The at least one second conductive member is configured to deliver a signal. One end of each of the plurality of conductive members is electrically connected with corresponding one of the two switch circuits, and the other end of the at least one first conductive member and the at least one third conductive member of the plurality of conductive members is electrically connected with the load. The switch circuit assembly and the magnetic assembly are stacked with each other.

In accordance with another aspect of the present disclosure, a voltage regulator module is provided. The voltage regulator module includes a switch circuit assembly, a magnetic assembly and a conductor assembly. The switch circuit assembly includes a switch circuit. The magnetic assembly includes at least one core assembly and at least one first conductive member. The core assembly has an opening. The at least one first conductive member penetrates through the opening. The switch circuit assembly, the magnetic assembly and the conductor assembly are stacked with each other in sequence. One end of the at least one first conductive member is electrically connected with corresponding switch circuit, and the other end of the at least one first conductive member is electrically connected with the conductor assembly. An inductor is defined by the at least one first conductive member penetrating through the opening and the core assembly collaboratively. The inductor is embedded in a printed circuit board.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
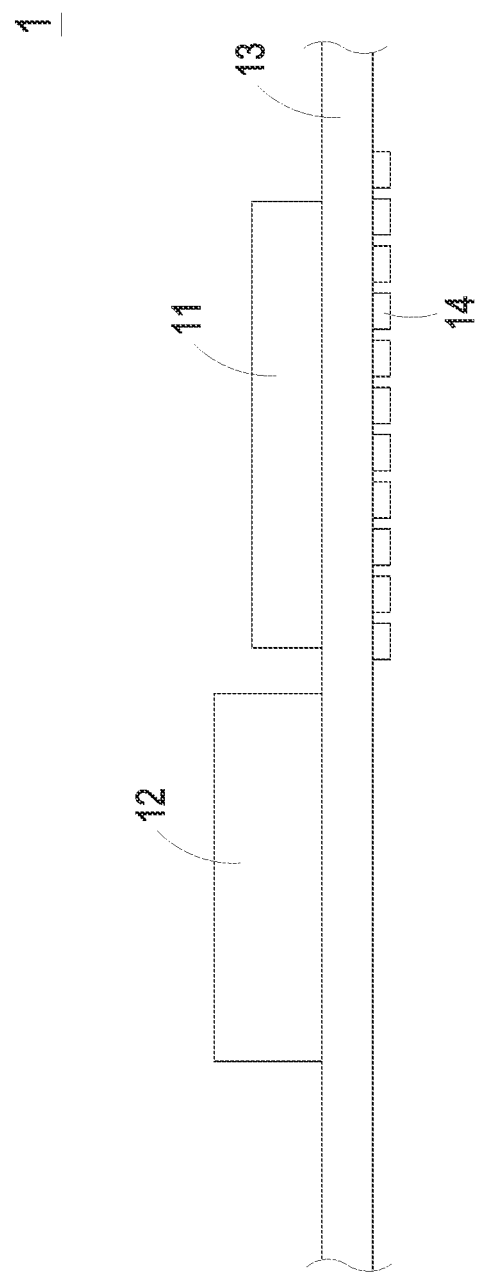
FIG. 1A schematically illustrates the structure of a conventional electronic device.
Figure 1B:
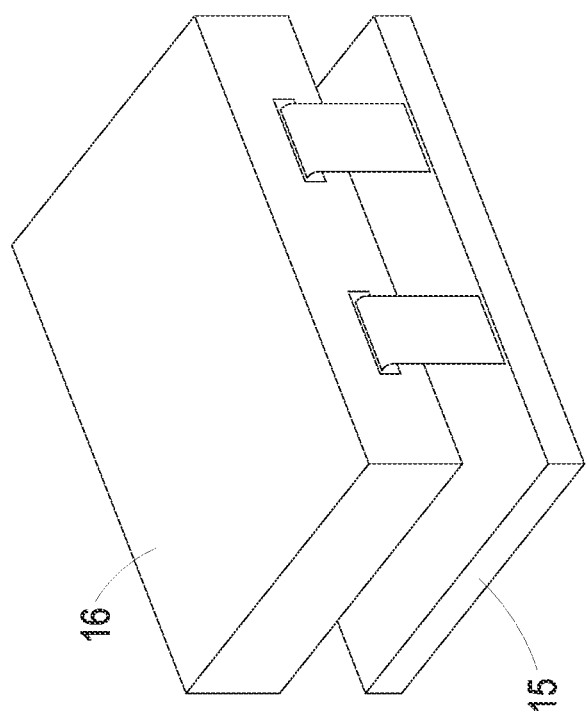
FIG. 1B schematically illustrates the structure of a voltage regulator module of the electronic device as shown in FIG. 1A.
Figure 2:
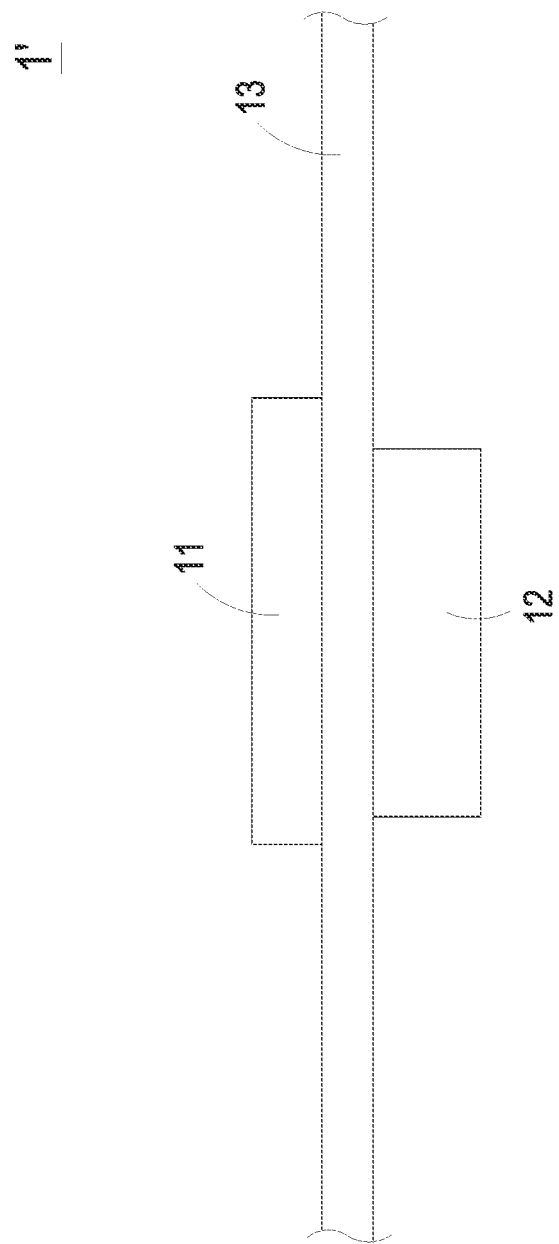
FIG. 2 schematically illustrates the structure of another conventional electronic device.
Figure 3A:
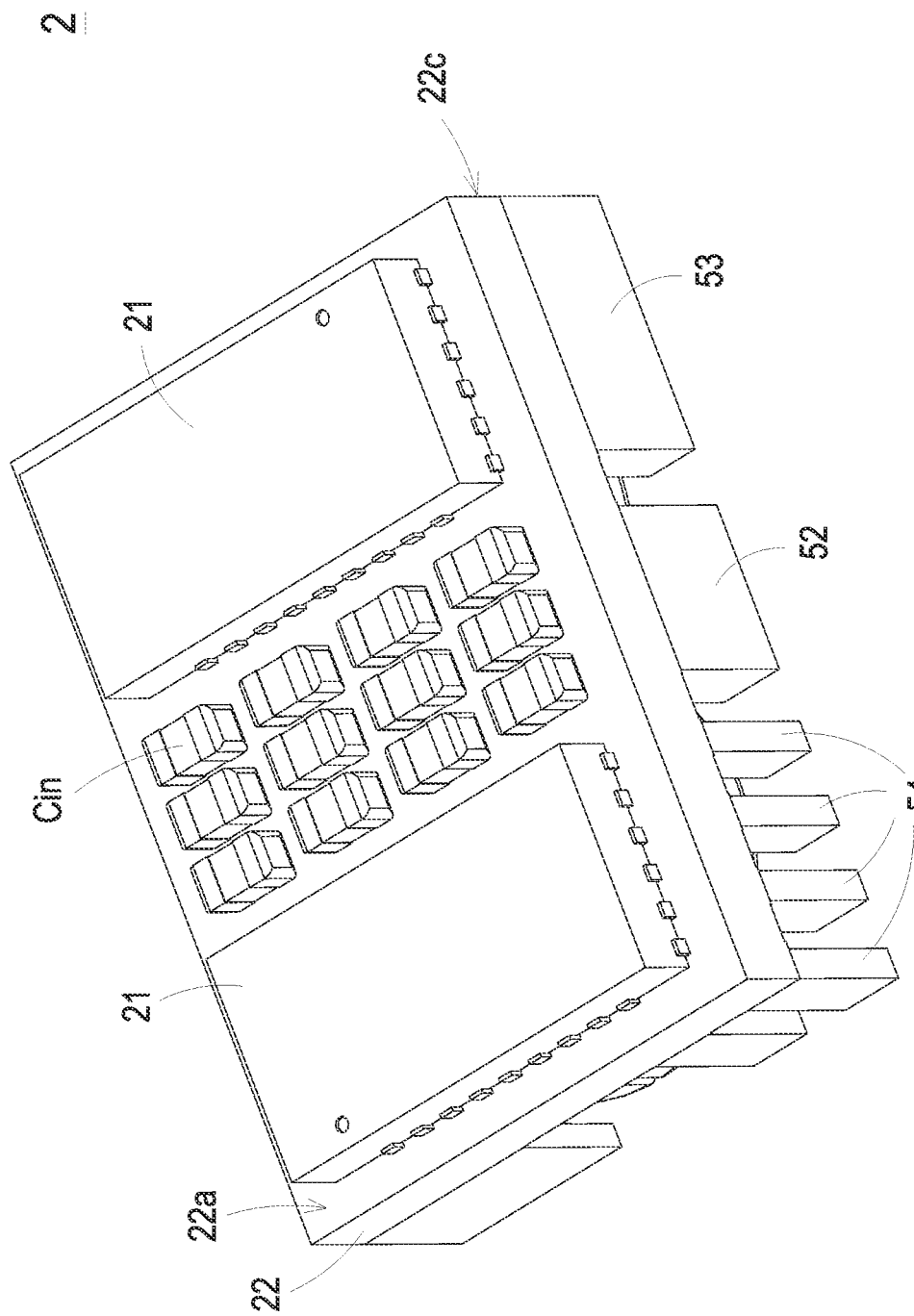
FIG. 3A is a schematic perspective view illustrating a voltage regulator module according to a first embodiment of the present disclosure and taken along a viewpoint.
Figure 3B:
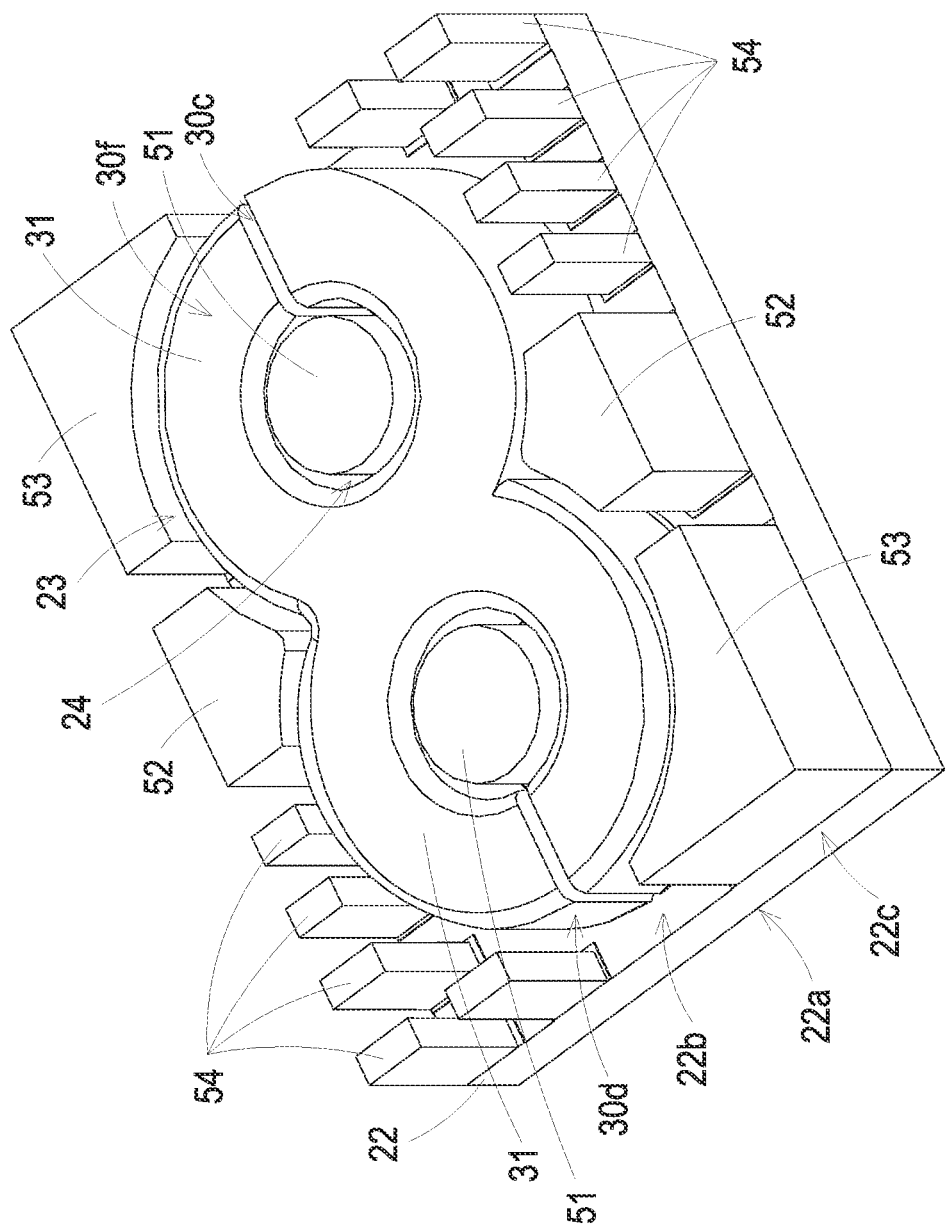
FIG. 3B is a schematic perspective view illustrating the voltage regulator module of FIG. 3A and taken along another viewpoint.
Figure 3C:
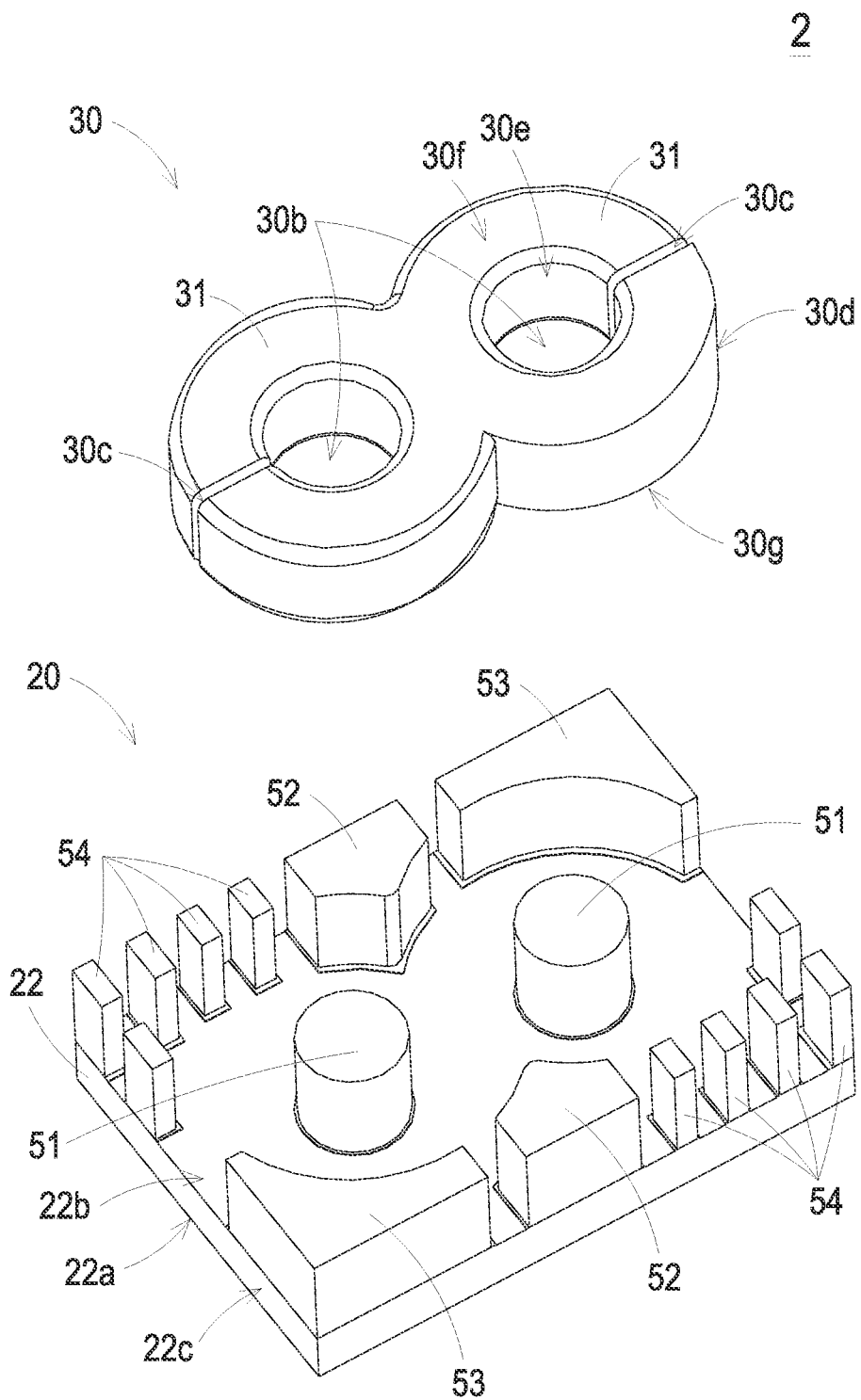
FIG. 3C is a schematic exploded view illustrating the voltage regulator module of FIG. 3B.
Figure 4:
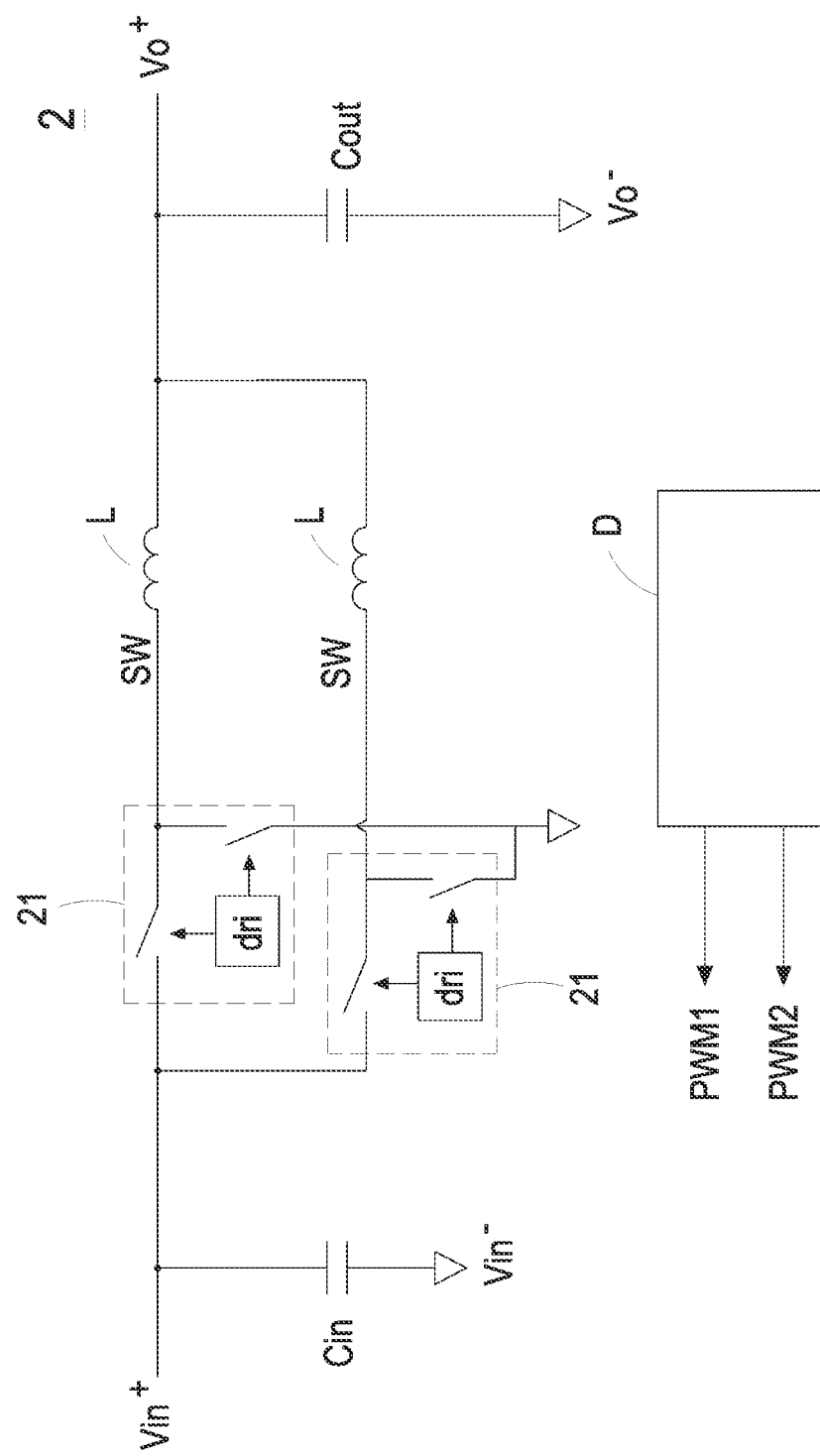
FIG. 4 is a schematic equivalent circuit diagram illustrating the voltage regulator module of FIG. 3A.

Please refer to FIGS. 3A, 3B, 3C and 4. FIG. 3A is a schematic perspective view illustrating a voltage regulator module according to a first embodiment of the present disclosure and taken along a viewpoint. FIG. 3B is a schematic perspective view illustrating the voltage regulator module of FIG. 3A and taken along another viewpoint. FIG. 3C is a schematic exploded view illustrating the voltage regulator module of FIG. 3B. FIG. 4 is a schematic equivalent circuit diagram illustrating the voltage regulator module of FIG. 3A. The voltage regulator module 2 may be disposed on an electronic device and electrically connected with a system board (not shown) within the electronic device through a welding means. The voltage regulator module 2 is at least one phase buck converter and includes at least one switch elements 21, at least one inductor L, at least one input capacitor Cin and at least one output capacitor Cout. For example, the switch element 21 is a driver and metal-oxide-semiconductor field-effect transistor (also referred as a Dr.MOS element 21). In case that the central processing unit of the electronic device requires a large amount of current, the voltage regulator module 2 is a multi-phase buck converter. Consequently, the capability of the voltage regulator module 2 to output electricity is effectively enhanced.

In the embodiment of FIG. 4, the voltage regulator module 2 is a two-phase buck converter. The voltage regulator module 2 includes two Dr.MOS elements 21 and two inductors L. Each Dr.MOS element 21 and a first terminal SW of the corresponding inductor L are electrically connected with each other in series to define a phase buck circuit. In this embodiment, the voltage regulator module 2 includes two phase buck circuits. The input side of the voltage regulator module 2 includes a positive input terminal Vin+ and a negative input terminal Vin−. The first terminals of the two phase buck circuits are connected with each other in parallel and electrically connected with the input capacitor Cin. The output side of the voltage regulator module 2 includes a positive output terminal Vo+ and a negative output terminal Vo−. The negative input terminal Vin− and the negative output terminal Vo− are electrically connected with a common terminal. The second terminals of the two phase buck circuits are connected with each other in parallel and electrically connected with the output capacitor Cout. A first terminal of the output capacitor Cout is electrically connected with the positive output terminal Vo+ of the voltage regulator module 2. A second terminal of the output capacitor Cout is electrically connected with the negative output terminal Vo− of the voltage regulator module 2. A first terminal of the input capacitor Cin is electrically connected with the positive input terminal Vin+ of the voltage regulator module 2. A second terminal of the input capacitor Cin is electrically connected with the negative input terminal Vin− of the voltage regulator module 2.

In an embodiment, each Dr.MOS element 21 includes a switch and a driver for driving the switch. The voltage regulator module 2 further includes a control circuit D. After the control circuit D samples the output voltage of the voltage regulator module 2 and the output current of each phase buck circuit, the control circuit D generates two pulse width modulation signals PWM1 and PWM2. The phase difference between the two pulse width modulation signals PWM1 and PWM2 is 180 degree. The first phase buck circuit and the second phase buck circuit are controlled according to the first pulse width modulation signal PWM1 and the second pulse width modulation signal PWM2, respectively.

Please refer to FIG. 3C. Structurally, the voltage regulator module 2 includes a circuit board assembly 20 and a magnetic core assembly 30. The circuit board assembly 20 includes a printed circuit board 22, at least one Dr.MOS element 21, at least one first copper post 51, at least one second copper post 52 and at least one third copper post 53. The printed circuit board 22 has a first surface 22a and a second surface 22b, which are opposed to each other. The printed circuit board 22 further includes a lateral wall 22c, which is arranged between the first surface 22a and the second surface 22b. All Dr.MOS elements 21 and all input capacitors Cin are mounted on the first surface 22a of the printed circuit board 22 by a welding process or through a conductive adhesive (see FIG. 3A). In addition, the input capacitors Cin are electrically connected with the Dr.MOS elements 21. In this embodiment, the installation directions of the two Dr.MOS elements 21 on the first surface 22a of the printed circuit board 22 are opposed. Consequently, the input voltage pins of the two Dr.MOS elements 21 are arranged near each other. The input capacitors Cin are arranged between the two Dr.MOS elements 21. That is, the input capacitors Cin are arranged between the input voltage pins of the two Dr.MOS elements 21. The input capacitors Cin are shared by the two Dr.MOS elements 21. Consequently, instead of routing wire, the nearby input voltage pins of the two Dr.MOS elements 21 are electrically connected with the input capacitors Cin, and the number of the input capacitors Cin is reduced.

The at least one first copper post 51, the at least one second copper post 52 and the at least one third copper post 53 are mounted on the second surface 22b of the printed circuit board 22 by a welding process or through a conductive adhesive. A portion of a lateral surface of the second copper post 52 and a portion of a lateral surface of the third copper post 53 are coplanar with the lateral wall 22c of the printed circuit board 22. The at least one first copper post 51 is used as the positive output terminal of the voltage regulator module 2. The at least one second copper post 52 is used as the positive input terminal of the voltage regulator module 2. The at least one third copper post 53 is used as the negative output terminal of the voltage regulator module 2.

In an embodiment, the circuit board assembly 20 of the voltage regulator module 2 further includes at least one fourth copper post 54. For example, as shown in FIGS. 3B and 3C, the circuit board assembly 20 further includes a plurality of fourth copper posts 54. A portion of a lateral surface of the fourth copper posts 54 is coplanar with the lateral wall 22c of the printed circuit board 22. The plurality of fourth copper posts 54 are mounted on the second surface 22b of the printed circuit board 22 by a welding process or through a conductive adhesive. The plurality of fourth copper posts 54 are used as signal terminals of the voltage regulator module 2. When the voltage regulator module 2 is welded on a system board (not shown), the voltage regulator module 2 is in communication with the system board through the plurality of fourth copper posts 54.

In an embodiment, the voltage regulator module 2 is welded on the system board through the at least one first copper post 51, the at least one second copper post 52, the at least one third copper post 53 and the at least one fourth copper post 54 of the circuit board assembly 20. Consequently, the size of the voltage regulator module 2 is reduced.

The magnetic core assembly 30 is disposed on the second surface 22b of the printed circuit board 22. Moreover, the magnetic core assembly 30 includes at least one ring-shaped core 31. In this embodiment, the voltage regulator module 2 is a two-phase buck converter. In other words, the magnetic core assembly 30 includes two ring-shaped cores 31. Each ring-shaped core 31 has a corresponding opening 30b. When the magnetic core assembly 30 is disposed on the second surface 22b of the printed circuit board 22, the first copper posts 51 are penetrated through the corresponding openings 30b. Consequently, two inductors L are defined by the corresponding first copper posts 51 and the magnetic core assembly 30 collaboratively.

In an embodiment, the magnetic core assembly 30 further includes at least one air gap 30c. As shown in FIGS. 3B and 3C, the magnetic core assembly 30 includes two air gaps 30c. The two air gaps 30c are formed in the corresponding ring-shaped cores 31 respectively and located at two opposite sides of the magnetic core assembly 30. In an embodiment, the two ring-shaped cores 31 of the magnetic core assembly 30 are integrally formed as an 8-shaped one-piece structure. Alternatively, the ring-shaped cores 31 are individual components and combined as the magnetic core assembly 30.

In this embodiment, the opening 30b of the magnetic core assembly 30 has a circular shape. The first copper post 51 also has a circular shape. It is noted that the profiles of the opening 30b and the first copper post 51 are not restricted. For example, the opening 30b has a rectangular shape or any other appropriate shape, and the first copper post 51 has the shape matching the opening 30b. An external surface 30d of the magnetic core assembly 30 has a circular shape. Moreover, the shape of the external surface 30d of the magnetic core assembly 30 is not restricted.

In an embodiment, some or all of the fourth copper posts 54 are previously disposed on a lead frame. Consequently, the lead frame with the fourth copper posts 54 can be welded on the printed circuit board 22 more easily, and the fourth copper posts 54 can be well disposed and positioned. Similarly, the at least one first copper post 51, the at least one second copper post 52 and the at least one third copper post 53 may be previously disposed on a lead frame so as to increase the installation efficiency. Hereinafter, an example of using the lead frame with the fourth copper posts 54 in the manufacturing process of the voltage regulator module 2 will be illustrated with reference to FIGS. 5 and 6.

Figure 5:
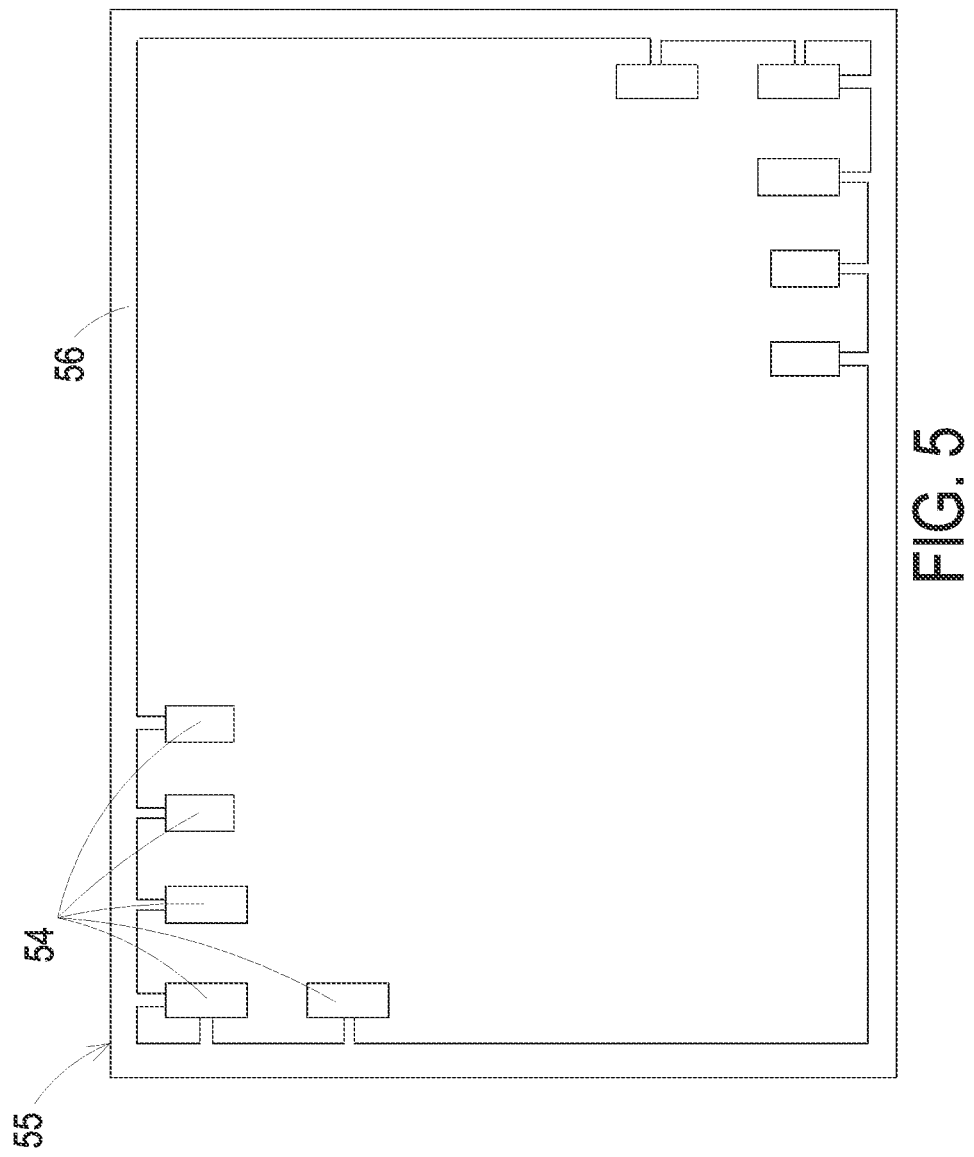
FIG. 5 schematically illustrates a lead frame with the fourth copper posts.
Figure 6:
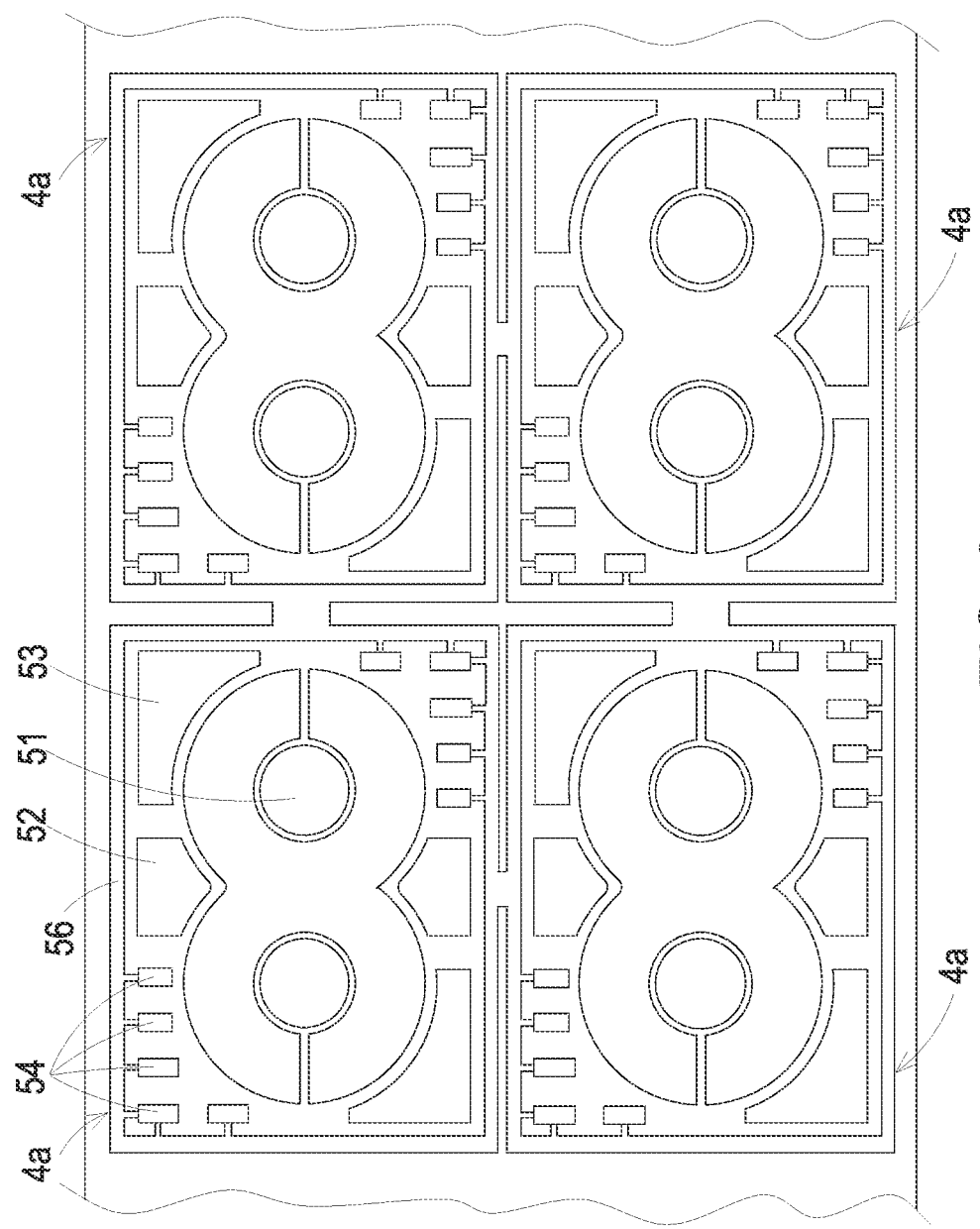
FIG. 6 schematically illustrates the concept of using the lead frame as shown in FIG. 5 to produce a plurality of voltage regulator modules.

FIG. 5 schematically illustrates a lead frame with the fourth copper posts. FIG. 6 schematically illustrates the concept of using the lead frame as shown in FIG. 5 to produce a plurality of voltage regulator modules. As shown in FIG. 5, the fourth copper posts 54 are previously disposed on a lead frame 55. The lead frame 55 includes a frame body 56. The fourth copper posts 54 are coupled to the inner periphery of the frame body 56. Since the lead frame 55 with the fourth copper posts 54 can be welded on the printed circuit board 22 more easily, the efficiency of installing the fourth copper posts 54 is enhanced. The above concept may be expanded to manufacture a plurality of voltage regulator modules 2. Please refer to FIG. 6. In some embodiments, a connection printed circuit board with a plurality of printed circuit boards 22 is provided. After a plurality of magnetic core assemblies 30 are mounted on the corresponding printed circuit boards 22, a plurality of semi-finished products 4a of the voltage regulator modules 2 are produced. Then, a plurality of lead frames 55 are disposed on the second surfaces 22b of the corresponding printed circuit boards 22. Then, the fourth copper posts 54 of each lead frame 55 are welded on the second surface 22b of the printed circuit board 22 of the corresponding semi-finished product 4a. Since the fourth copper posts 54 are firstly fixed by the lead frame 55 and then welded on the corresponding printed circuit board 22, the fourth copper posts 54 will not be shifted during the welding process or in the subsequent process. For example, the fourth copper posts 54 are not shifted in the packaging process. In an embodiment, the at least one first copper post 51, the at least one second copper post 52 and the at least one third copper post 53 are disposed on the second surface 22b of the corresponding printed circuit board 22 before the lead frame 55 is welded on the corresponding printed circuit board 22. In another embodiment, the at least one first copper post 51, the at least one second copper post 52 and the at least one third copper post 53 are welded on the second surface 22b of the corresponding printed circuit board 22 after the lead frame 55 is welded on the corresponding printed circuit board 22. Please refer to FIG. 6 again. After the plurality of semi-finished products 4a of the voltage regulator modules 2 are packaged, the junctions between the frame body 56 and the fourth copper posts 54 of each semi-finished product 4a are cut off and the junctions between the adjacent semi-finished products 4a of the connection printed circuit board are cut off. Consequently, a plurality of individual voltage regulator modules 2 are produced.

Figure 7A:
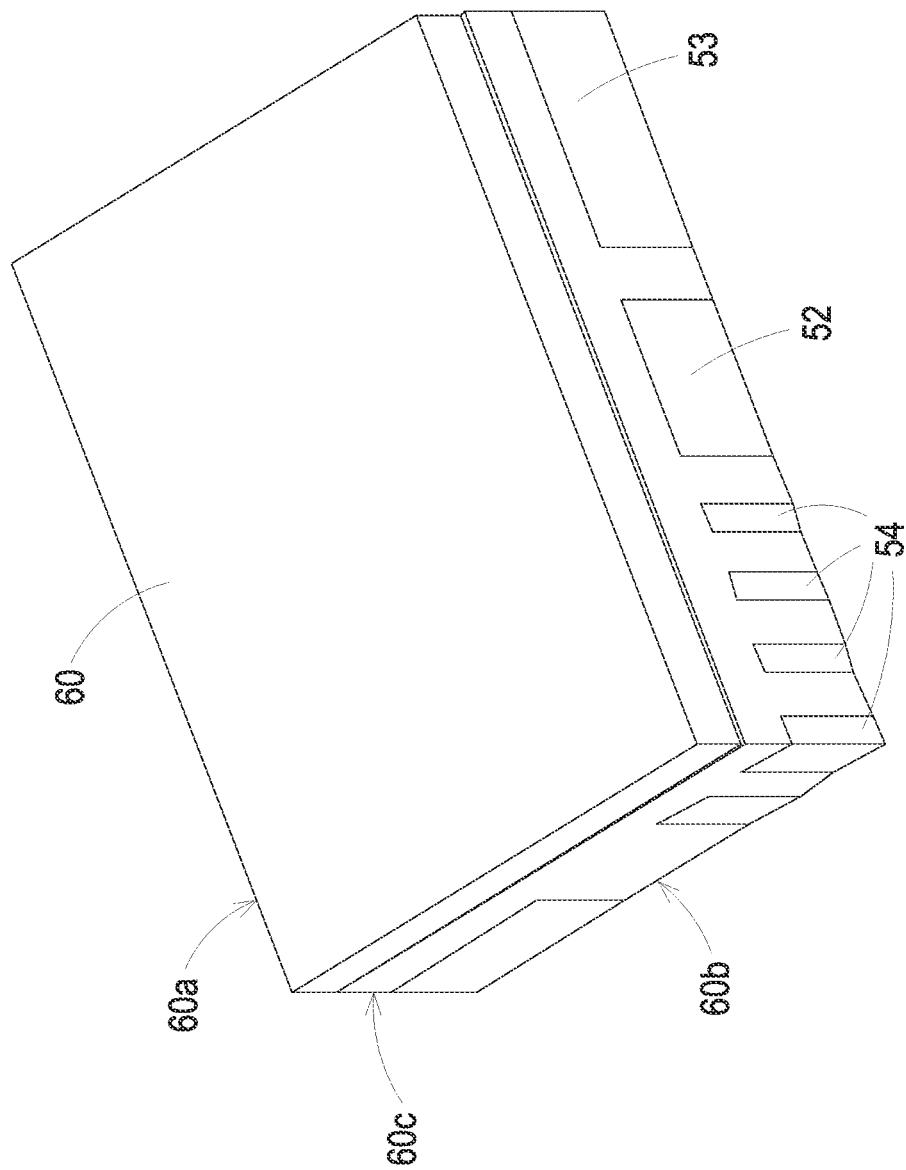
FIG. 7A is a schematic perspective view illustrating a package structure of the voltage regulator module according to the embodiment of the present disclosure.
Figure 7B:
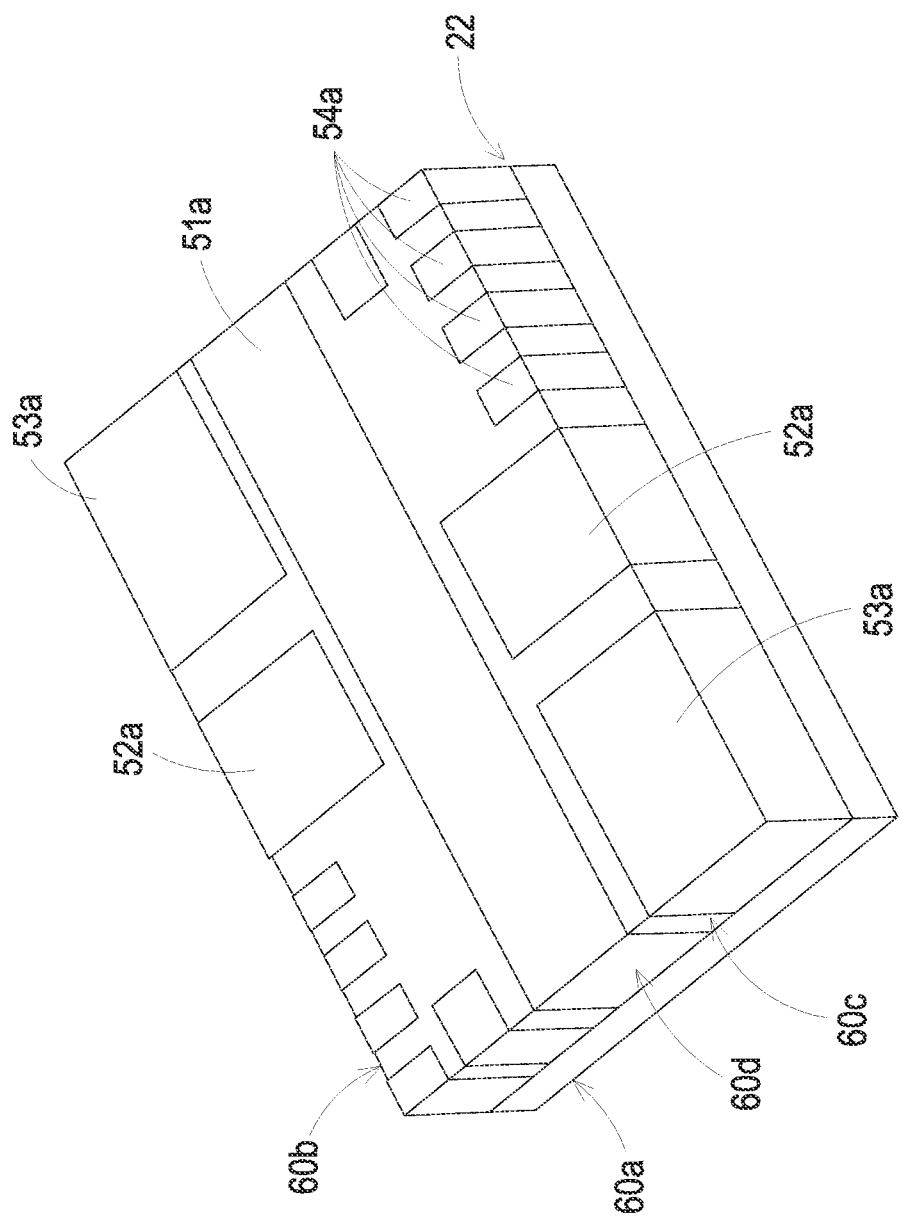
FIG. 7B is a schematic perspective view illustrating the package structure of the voltage regulator module as shown in FIG. 7A and taken along another viewpoint.

Please refer to FIGS. 7A and 7B. FIG. 7A is a schematic perspective view illustrating a package structure of the voltage regulator module according to the embodiment of the present disclosure. FIG. 7B is a schematic perspective view illustrating the package structure of the voltage regulator module as shown in FIG. 7A and taken along another viewpoint. The voltage regulator module 2 further includes a molding compound layer 60. The first surface 22a of the printed circuit board 22, the components on the first surface 22a of the printed circuit board 22 (e.g., the Dr.MOS elements 21 and the input capacitors Cin), the second surface 22b of the printed circuit board 22 and the components on the second surface 22b of the printed circuit board 22 (e.g., the copper posts 51, 52, 53 and 54) are encapsulated by the molding compound layer 60 in a double-sided molding manner. The molding compound layer 60 includes a first molding side 60a, a second molding side 60b and a lateral molding wall 60c. The first molding side 60a of the molding compound layer 60 and the first surface 22a of the printed circuit board 22 are located at the same side of the printed circuit board 22. The second molding side 60b of the molding compound layer 60 and the second surface 22b of the printed circuit board 22 are located at the same side of the printed circuit board 22. The first molding side 60a and the second molding side 60b are opposed to each other. The lateral molding wall 60c of the molding compound layer 60 is arranged between the first molding side 60a and the second molding side 60b. In some embodiments, the first molding side 60a of the molding compound layer 60 is milled to adjust the thermal resistances of the heat generation components on the first surface 22a of the printed circuit board 22 (e.g., the Dr.MOS elements 21 and the input capacitors Cin). Optionally, after the first molding side 60a of the molding compound layer 60 is milled, the Dr.MOS elements 21 are exposed outside the first molding side 60a of the molding compound layer 60. The external surface of the first molding side 60a of the molding compound layer 60 is a flat surface. The external surface is attached and fixed on a casing or a heat sink of the electronic device. Consequently, the thermal resistance is further reduced, and the heat dissipating capability of the voltage regulator module is increased.

Similarly, the second molding side 60b of the molding compound layer 60 is milled. Consequently, the end surfaces of the copper posts 51, 52, 53 and 54 are exposed outside the second molding side 60b of the molding compound layer 60 and coplanar with the second molding side 60b of the molding compound layer 60. Moreover, the exposed portions of the copper posts 51, 52, 53 and 54 may be chemically plated. Consequently, the exposed portions of the copper posts 51, 52, 53 and 54 are used as bonding pads with larger areas.

Please refer to FIGS. 7A and 7B again. A first bonding pad 51a corresponding to the end surface of the first copper post 51 located in the second molding side 60b is used as a positive output terminal conductor of the voltage regulator module 2. The first bonding pad 51a has a strip shape in the second molding side 60b. Moreover, the two ends of the first bonding pad 51a are connected with two lateral sides of the lateral molding wall 60c of the molding compound layer 60. Moreover, two electroplated regions 60d are formed on the lateral sides of the lateral molding wall 60c. When the voltage regulator module 2 on the system board undergoes a reflow soldering process, the electroplated regions 60d can provide lateral wetting capability. Consequently, the welding strength of the combination between the voltage regulator module 2 and the system board is enhanced. Moreover, a second bonding pad 52a corresponding to the end surface of the second copper post 52 located in the second molding side 60b is used as a positive input terminal conductor of the voltage regulator module 2. A third bonding pad 53a corresponding to the end surface of the third copper post 53 located in the second molding side 60b is used as a negative output terminal conductor of the voltage regulator module 2. A fourth bonding pad 54a corresponding to the end surface of the fourth copper post 54 located in the second molding side 60b is used as a signal terminal conductor. The electroplated regions 60d, the second bonding pad 52a, the third bonding pad 53a and the fourth bonding pad 54a can increase the overall area of the bonding pad, reduce the average forces on the solder joints of the copper posts 51, 52, 53 and 54 and increase the strength of the solder joints. In addition, the weight withstood by the unit welding surface is reduced, the purpose of diffusing current is achieved, and the power loss is reduced. Moreover, since the first molding side 60a and the second molding side 60b of the molding compound layer 60 can be milled, the overall height of the voltage regulator module 2 is adjustable. Preferably, the area of the first bonding pad 51a (i.e., the positive output terminal conductor) is larger than or equal to the end surface area of the first copper post 51, the area of the second bonding pad 52a (i.e., the positive input terminal conductor) is larger than or equal to the end surface area of the second copper post 52, and the area of the third bonding pad 53a (i.e., the negative output terminal conductor) is larger than or equal to the end surface area of the third copper post 53.

In an embodiment, the second molding side 60b of the molding compound layer 60 is milled such that a surface of the magnetic core assembly 30 is exposed. When the voltage regulator module 2 is welded on the system board, the exposed surface of the magnetic core assembly 30 can be attached on the system board directly. Consequently, the heat dissipating capability of the magnetic core assembly 30 is enhanced.

In some embodiments, the lateral molding wall 60c of the molding compound layer 60 is milled. Consequently, portions of the surfaces of the copper posts 52, 53 and 54 are exposed outside the lateral molding wall 60*c* of the molding compound layer 60. Moreover, the exposed portions of the surfaces of the copper posts 52, 53 and 54 may be chemically plated. Consequently, the portion of the second copper post 52 exposed outside the lateral molding wall 60*c* is connected with the second bonding pad 52*a* (i.e., the positive input terminal conductor), the portion of the third copper post 53 exposed outside the lateral molding wall 60*c* is connected with the third bonding pad 53*a* (i.e., the negative output terminal conductor), and the portion of the fourth copper post 54 exposed outside the lateral molding wall 60*c* is connected with the fourth bonding pad 54*a* (i.e., the signal terminal conductor). When the voltage regulator module 2 on the system board undergoes a reflow soldering process, the electroplated regions of the copper posts 52, 53 and 54 can provide lateral wetting capability. Consequently, the welding strength of the combination between the voltage regulator module 2 and the system board is enhanced.

Please refer to FIGS. 3B and 3C. The circuit board assembly of the voltage regulator module 2 includes two first copper posts 51 and two second copper posts 52. The two first copper posts 51 are located at a middle region of the printed circuit board 22. The two second copper posts 52 are respectively located beside two sides of the midpoint of the two first copper posts 51. The two second copper posts 52 are disposed on the second surface 22*b* of the printed circuit board 22 and symmetric with respect to the midpoint of the two first copper posts 51. Moreover, the two second copper posts 52 are arranged beside the region between the two first copper posts 51. The circuit board assembly 20 of the voltage regulator module 2 includes two third copper posts 53. The second surface 22*b* of the printed circuit board 22 has four corners. Two corners are arranged along a first diagonal line and symmetric with respect to the midpoint of the second surface 22*b* of the printed circuit board 22. The other two corners are arranged along a second diagonal line and symmetric with respect to the midpoint of the second surface 22*b* of the printed circuit board 22. The two third copper posts 53 are disposed on the second surface 22*b* of the printed circuit board 22 and located at the two corners along the first diagonal line, respectively. Moreover, the two third copper posts 53 are respectively located beside two sides of the midpoint of the two first copper posts 51. Portion of the plurality of fourth copper posts 54 and the rest of the plurality of fourth copper posts 54 are disposed on the second surface 22*b* of the printed circuit board 22 and located at the two corners along the second diagonal line respectively. When the voltage regulator module 2 is welded on the system board, the voltage regulator module 2 is in communication with the system board through the signal terminals.

In some embodiments, the magnetic core assembly 30 is fixed on the second surface 22*b* of the printed circuit board 22 through a thermal adhesive. Consequently, the heat dissipating capability of the magnetic core assembly 30 is enhanced. In this embodiments, there is a first gap 23 between the external surface 30*d* of the magnetic core assembly 30 and the second copper post 52 (and the third copper post 53), and there is a second gap 24 between an inner wall 30*e* of the magnetic core assembly 30 and the first copper post 51. An underfill material is filled in the first gap 23 and the second gap 24. Consequently, the magnetic core assembly 30, the printed circuit board 22 and the adjacent copper posts are contacted with each other through the underfill material. Due to the underfill material, no vacant spaces exit in the first gap 23 and the second gap 24 after the packaging process is completed.

As mentioned above, the voltage regulator module 2 is encapsulated by the molding compound layer 60 through the double-sided plastic molding process. Moreover, the copper posts 51, 52, 53 and 54 are chemically plated to generate the corresponding bonding pads. The bonding pads are electrically connected with the system board. Consequently, when the voltage regulator module on the system board undergoes a reflow soldering process, the inner components to be reheated are not detached or shifted. In other words, the process of fabricating the voltage regulator module 2 is simplified.

It is noted that the example of the voltage regulator module may be modified. For example, the magnetic core assembly 30, the first copper posts 51, the second copper posts 52 and the third copper posts 53 are embedded within the printed circuit board 22. Moreover, the second surface 22*b* of the printed circuit board 22 is electroplated to form the first bonding pad 51*a* (i.e., the positive output terminal conductor), the second bonding pad 52*a* (i.e., the positive input terminal conductor), the third bonding pad 53*a* (i.e., the negative output terminal conductor) and the fourth bonding pad 54*a*.

Figure 8:
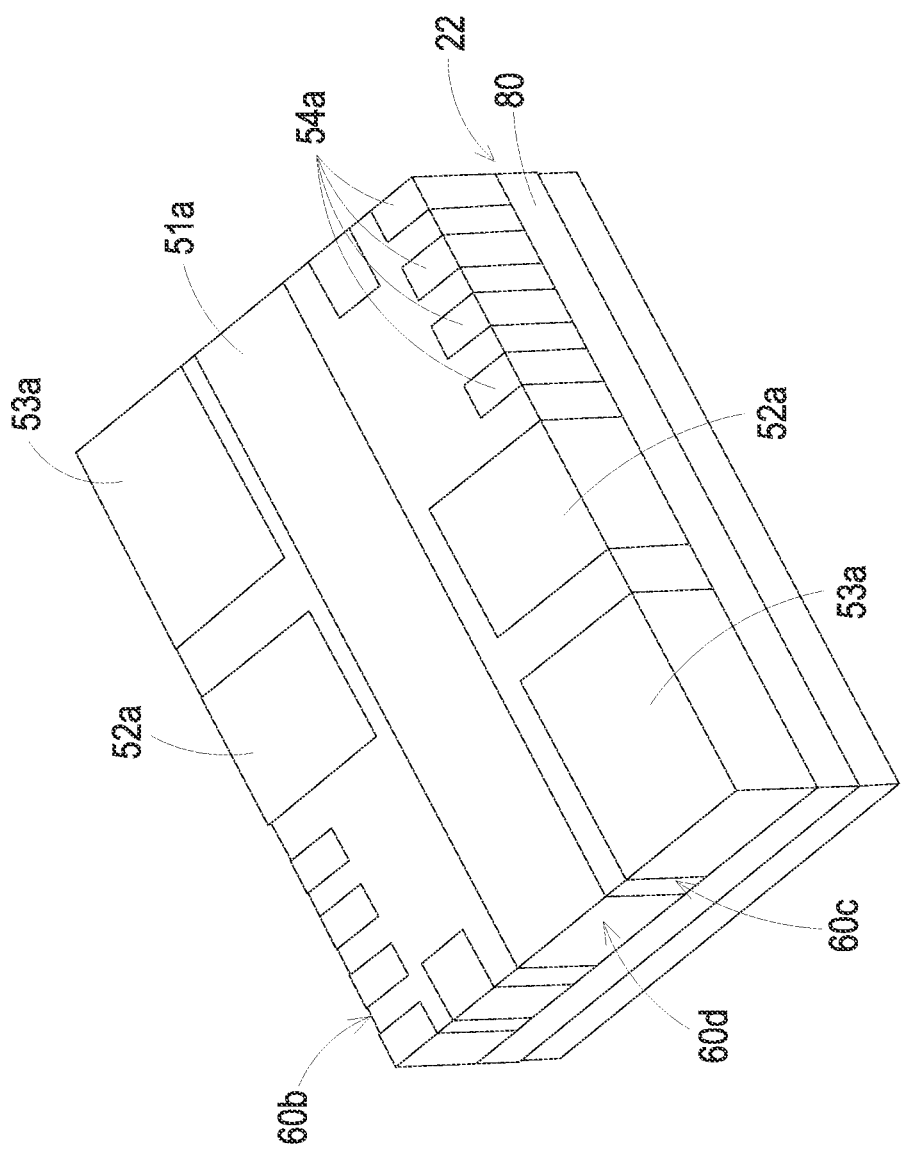
FIG. 8 is a schematic perspective view illustrating a package structure of a voltage regulator module according to another embodiment of the present disclosure.

FIG. 8 is a schematic perspective view illustrating a package structure of a voltage regulator module according to another embodiment of the present disclosure. In comparison with the above embodiment, the printed circuit board 22 includes an inner layer 80. That is, the printed circuit board 22 is a multilayered printed circuit board 22. As shown in FIG. 3B, the magnetic core assembly 30 has a top surface 30*f* and a bottom surface 30*g*. After an electroplating process is performed, a first copper electrode and a second copper electrode are formed on the top surface 30*f* and the bottom surface 30*g*, respectively. Moreover, the magnetic core assembly 30, the first copper posts 51, the second copper posts 52 and the third copper posts 53 are fixed and embedded within the inner layer 80 of the printed circuit board 22.

Figure 9:
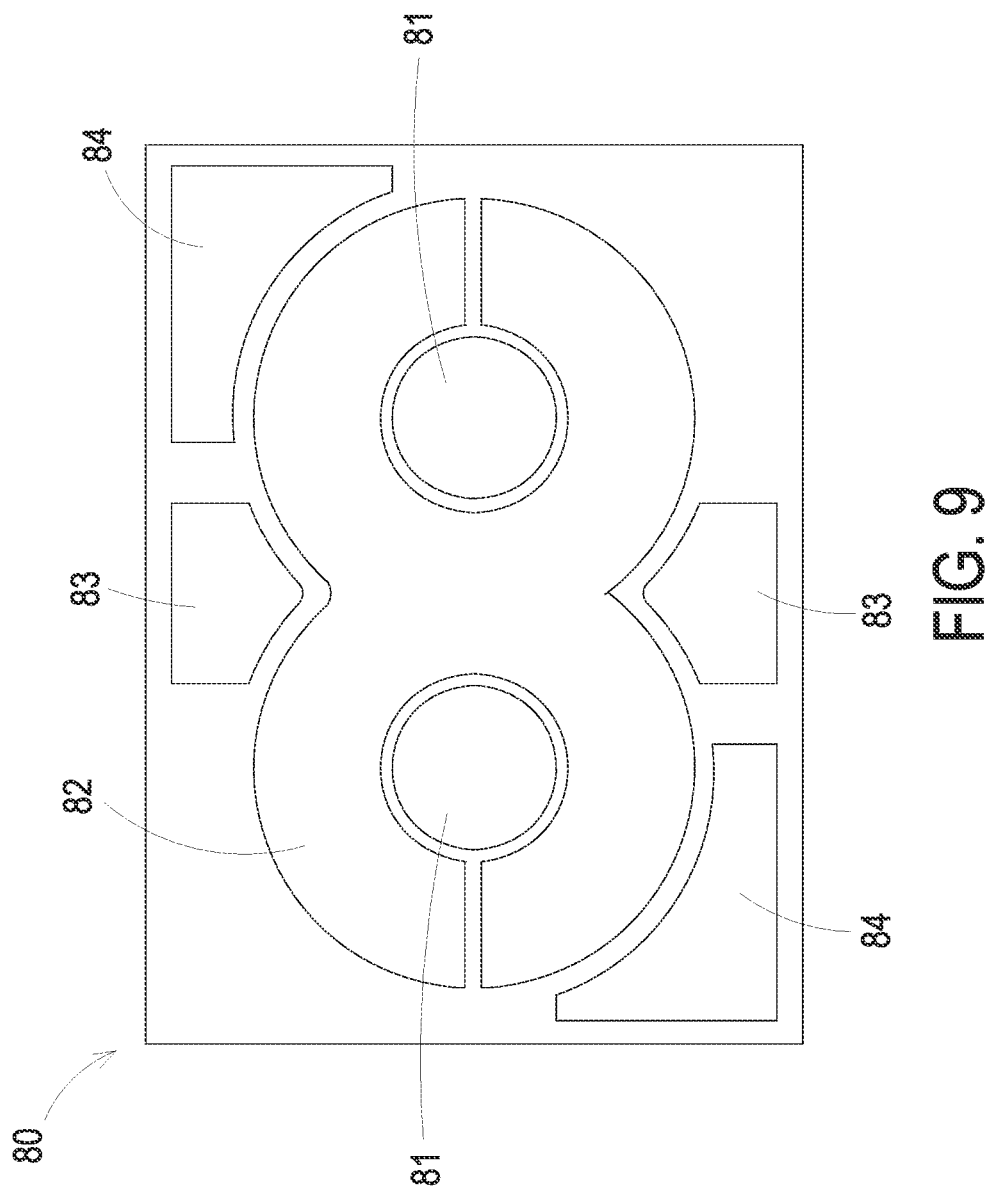
FIG. 9 is a schematic top cross-sectional view illustrating the inner layer of the printed circuit board of the voltage regulator module as shown in FIG. 8.

FIG. 9 is a schematic top cross-sectional view illustrating the inner layer of the printed circuit board of the voltage regulator module as shown in FIG. 8. The inner layer 80 includes a switch region 81, a magnetic core region 82, a positive input region 83 and a negative output region 84. The first copper posts 51 are disposed and fixed on the switch region 81. The magnetic core assembly 30 is disposed and fixed on the magnetic core region 82. The second copper posts 52 are disposed and fixed on the positive input region 83 and used as the positive input terminal of the voltage regulator module 2. The third copper posts 53 are disposed and fixed on the negative output region 84 and used as the negative output terminal of the voltage regulator module 2. In some embodiments, the magnetic core region 82 is connected with the positive input region 83 to form a connection region. Alternatively, the magnetic core region 82 is connected with the negative output region 84 to form a connection region.

In an embodiment, a plurality of plated through-holes corresponding to the first copper posts 51, the second copper posts 52, the third copper posts 53, the first copper electrode and the second copper electrode are formed in the first surface 22*a* and the second surface 22*b* of the printed circuit board 22. The switch region 81, the magnetic core region 82, the positive input region 83 and the negative output region 84 are connected with corresponding pins of the Dr.MOS elements 21, which are mounted on the first surface 22a of the printed circuit board 22 through the corresponding plated through-holes.

Figure 10A:
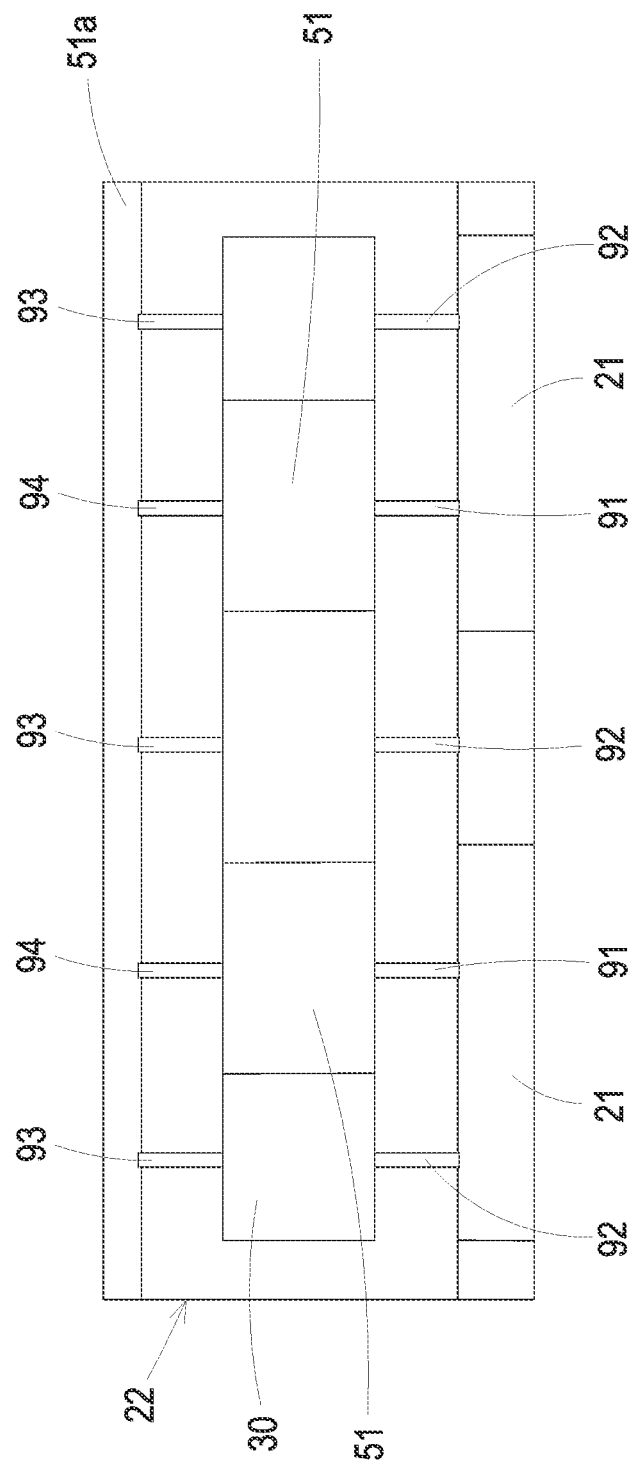
FIG. 10A is a schematic cross-sectional view illustrating the package structure of the voltage regulator module as shown in FIG. 8.

FIG. 10A is a schematic cross-sectional view illustrating the package structure of the voltage regulator module as shown in FIG. 8. The printed circuit board 22 includes first plated through-holes 91 and second plated through-holes (PTH) 92. The first copper posts 51 and the corresponding pins of the Dr.MOS elements 21 on the first surface 22a of the printed circuit board 22 are electrically connected with each other through the corresponding first plated through-holes 91. The second copper electrode of the magnetic core assembly 30 and the corresponding pins of the Dr.MOS elements 21 on the first surface 22a of the printed circuit board 22 are electrically connected with each other through the corresponding second plated through-holes 92. Moreover, the printed circuit board 22 includes signal plated through-holes (not shown) for connecting the fourth bonding pad 54a with the corresponding pins of the Dr.MOS elements 21 on the first surface 22a of the printed circuit board 22.

As shown in FIG. 10A, the printed circuit board 22 further includes third plated through-holes 93 and fourth plated through-holes 94. The first bonding pad 51a and the first copper electrode of the magnetic core assembly 30 are electrically connected with each other through the corresponding third plated through-holes 93. The first bonding pad 51a and the first copper posts 51 are electrically connected with each other through the corresponding fourth plated through-holes 94.

Figure 10B:
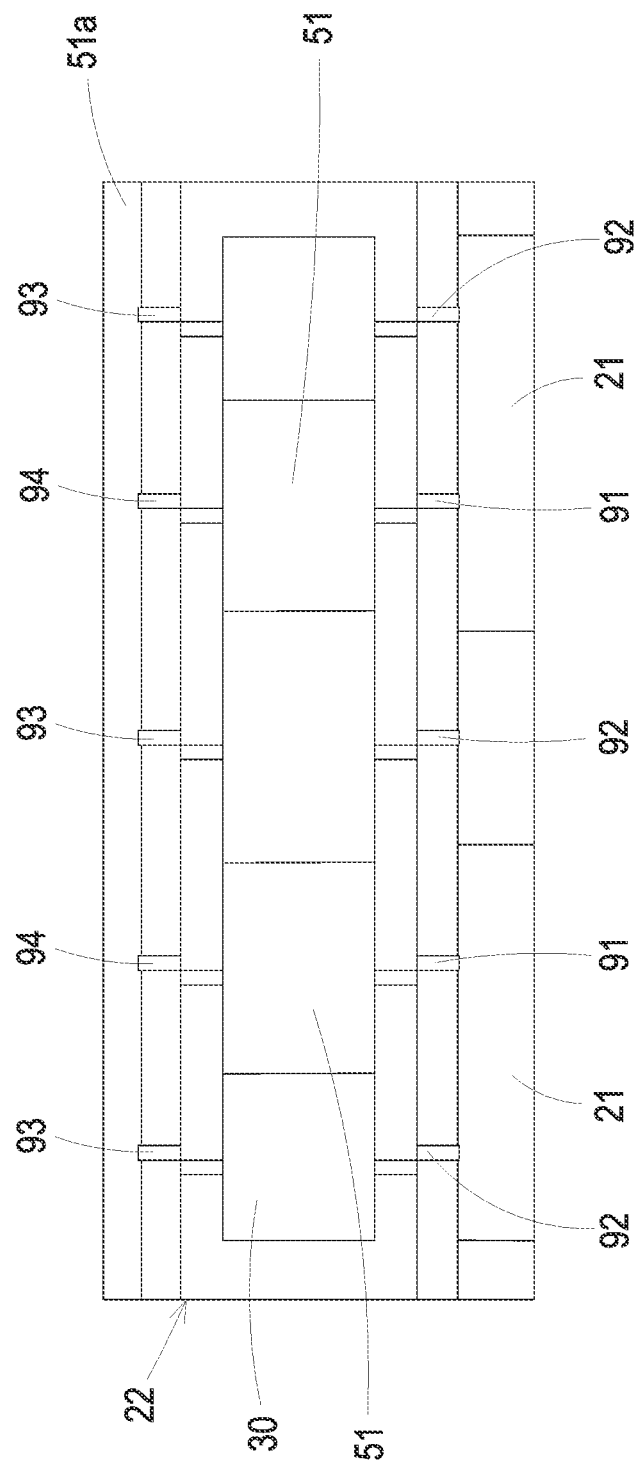
FIG. 10B is a schematic cross-sectional view illustrating a variant example of the package structure of the voltage regulator module as shown in FIG. 10A.

In this embodiment, the plated through-holes 91, 92, 93 and 94 are straight holes. It is noted that numerous modifications and alterations may be made while retaining the teachings of the disclosure. FIG. 10B is a schematic cross-sectional view illustrating a variant example of the package structure of the voltage regulator module as shown in FIG. 10A. In the variant example, the plated through-holes 91, 92, 93 and 94 are stepped holes.

Since the copper electrodes are disposed on the top surface and the bottom surface of the magnetic core assembly 30 and the copper electrodes are electrically connected with the bonding pads through the corresponding plated through-holes, the interface thermal resistance between the magnetic core assembly 30 and the surfaces of the printed circuit board 22 is reduced. In such way, the heat generated by the magnetic core assembly 30 can be transferred to the surfaces of the printed circuit board 22 through the corresponding plated through-holes and dissipated away.

Similarly, the second bonding pad 52a (i.e., the positive input terminal conductor) is electrically connected with the second copper posts 52 through corresponding plated through-holes (not shown), and the third bonding pad 53a (i.e., the negative output terminal conductor) is electrically connected with the third copper posts 53 through corresponding plated through-holes (not shown). In some embodiments, the fourth copper posts are replaced by corresponding signal through-holes (not shown). Moreover, one end of each signal through-hole is contacted with the corresponding pin of the Dr.MOS element 21, and the other end of each signal through-hole is contacted with the fourth bonding pad 54a.

Moreover, the copper posts 52, 53 and 54 are exposed to the lateral molding wall 60c of the molding compound layer 60. The exposed portions of the copper posts 52, 53 and 54 are electroplated to form electroplated regions. When the voltage regulator module 2 on the system board undergoes a reflow soldering process, the electroplated regions can provide lateral wetting capability. Consequently, the welding strength of the combination between the voltage regulator module 2 and the system board is enhanced.

In an embodiment, the height of the magnetic core assembly 30, the height of the first copper post 51, the height of the second copper post 52 and the height of the third copper post 53 are equal. Moreover, the magnetic core assembly 30, the first copper post 51, the second copper post 52 and the third copper post 53 are welded on the same inner layer 80 of the printed circuit board 22. It is noted that the heights of the magnetic core assembly and the copper posts may be different from each other and the magnetic core assembly and the copper posts may be fixed on different inner layers.

In this embodiment, the magnetic core assembly 30 is disposed on the inner layer 80 of the printed circuit board 22. Consequently, the second surface 22b of the printed circuit board 22 has more layout area for arranging the first bonding pad 51a, the second bonding pad 52a, the third bonding pad 53a and the fourth bonding pad 54a. Since the area of at least one of the first bonding pad 51a, the second bonding pad 52a, the third bonding pad 53a and the fourth bonding pad 54a is increased, the welding area and the welding strength between the corresponding bonding pad and the system board are increased and the average force on the voltage regulator module is reduced. In addition, the weight withstood by the unit welding surface is reduced, the purpose of diffusing current is achieved, and the power loss is reduced.

From the above descriptions, the present disclosure provides the voltage regulator module. The switch elements and the magnetic core assembly are disposed on two opposite sides of the printed circuit board. The first surface of the printed circuit board is encapsulated. The magnetic core assembly and the copper posts are embedded within the printed circuit board. The conductors formed on the second surface of the printed circuit board are welded on the system board. Alternatively, the copper posts are disposed on the circuit board, encapsulated by a double-sided plastic molding process, and welded on the system board. When the voltage regulator module on the system board undergoes a reflow soldering process, the inner components to be heated are not detached or shifted. In other words, the process of fabricating the voltage regulator module is simplified. When compared with the conventional voltage regulator module, the size of the voltage regulator module of the present disclosure is reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator module for powering a load, comprising: a switch circuit assembly, comprising: two switch circuits, wherein respective input terminals of the two switch circuits are connected with each other in parallel; and an input capacitor, wherein the input capacitor is electrically connected with the respective input terminals of the two switch circuits in parallel and disposed between the two switch circuits; and a magnetic assembly, comprising: a core assembly; and a plurality of conductive members, wherein the plurality of conductive members have at least one first conductive member, at least one second conductive member and at least one third conductive member, and the at least one first conductive member and the at least one third conductive member are configured to deliver an electric energy, and the at least one second conductive member is configured to deliver a signal, one end of each of the plurality of conductive members is electrically connected with corresponding one of the two switch circuits, and the other end of the at least one first conductive member and the at least one third conductive member of the plurality of conductive members is electrically connected with the load; wherein the switch circuit assembly and the magnetic assembly are stacked with each other, wherein the at least one first conductive member comprises two first conductive members, one end of each of the two first conductive members is connected with the corresponding one of the two switch circuits, and the other end of each of the two first conductive members is defined as a positive output terminal of the voltage regulator module.

2. The voltage regulator module according to claim 1, wherein the core assembly comprises two openings, and the two first conductive members penetrate through corresponding one of the two openings, respectively.

3. The voltage regulator module according to claim 1, wherein the at least one second conductive member comprises two second conductive members, one end of each of the two second conductive members receives a pulse width modulation signal, wherein a phase difference between the pulse width modulation signal received by one of the two second conductive members and the pulse width modulation signal received by the other of the two second conductive members is 180 degree, and the switch circuit connected with the corresponding second conductive member is controlled according to the pulse width modulation signal received by the corresponding second conductive member.

4. The voltage regulator module according to claim 1, further comprising a conductor assembly, wherein the switch circuit assembly, the magnetic assembly and the conductor assembly are stacked with each other in sequence.

5. The voltage regulator module according to claim 4, wherein the conductor assembly comprises a positive output terminal conductor, a positive input terminal conductor and a negative output terminal conductor,
wherein the positive output terminal conductor is electrically connected with the corresponding first conductive member, and the positive input terminal conductor and the negative output terminal conductor are electrically connected with the corresponding third conductive member, respectively;
wherein an area of any conductor of the positive output terminal conductor, the positive input terminal conductor and the negative output terminal conductor is larger than or equal to a surface area of the corresponding first conductive member or the corresponding third conductive member, respectively.

6. The voltage regulator module according to claim 5, wherein the conductor assembly further comprises a signal terminal conductor, electrically connected with the corresponding second conductive member.

7. The voltage regulator module according to claim 1, wherein the two switch circuits are substantially symmetric with each other.

8. The voltage regulator module according to claim 1, wherein the two switch circuits are substantially centrosymmetric along a diagonal line of the switch circuit assembly.

9. The voltage regulator module according to claim 1, wherein each of the two switch circuits is electrically connected with the magnetic assembly, and each of the two switch circuits and the magnetic assembly are collaboratively served as one phase buck circuit of the voltage regulator module.

10. The voltage regulator module according to claim 1, wherein each of the two switch circuits comprises a first switch and a second switch, and the first switch is electrically connected with the second switch in series.

11. A voltage regulator module, comprising: a switch circuit assembly comprising a switch circuit; a magnetic assembly comprising at least one core assembly and at least one first conductive member, wherein the core assembly has an opening, and the at least one first conductive member penetrates through the opening; and a conductor assembly, wherein the switch circuit assembly, the magnetic assembly and the conductor assembly are stacked with each other in sequence; wherein one end of the at least one first conductive member is electrically connected with corresponding switch circuit, and the other end of the at least one first conductive member is electrically connected with the conductor assembly; wherein an inductor is defined by the at least one first conductive member penetrating through the opening and the core assembly collaboratively, and the inductor is embedded in a printed circuit board, wherein two ends of the at least one first conductive member are electrically connected with the conductor assembly and corresponding one of the two switch circuit through at least one via, respectively.

12. The voltage regulator module according to claim 11, wherein two ends of the at least one first conductive member are electrically connected with the conductor assembly and the corresponding one of the two switch circuits through a same via.

13. The voltage regulator module according to claim 11, wherein one end of the at least one first conductive member is electrically connected with the corresponding one of the two switch circuits through a first via, and the other end of the at least one first conductive member is electrically connected with the conductor assembly through a second via, wherein the first via is different from the second via.

14. The voltage regulator module according to claim 13, wherein the first via and the second via are straight.

15. The voltage regulator module according to claim 13, wherein the first via and the second via are stepped.

16. The voltage regulator module according to claim 11, wherein the via is straight or stepped.

17. The voltage regulator module according to claim 11, wherein the magnetic assembly comprises a second conductive member and a third conductive member, and two ends of each conductive member of the second conductive member and the third conductive member are electrically connected with the conductor assembly and corresponding one of the two switch circuits through at least one via, respectively.

18. The voltage regulator module according to claim 17, wherein the conductor assembly comprises a positive input terminal conductor and at least one negative output terminal conductor, wherein the positive input terminal conductor or the at least one negative output terminal conductor is electrically connected with the third conductive member,
wherein an area of the positive input terminal conductor or an area of the at least one negative output terminal conductor is larger than or equal to a surface area of the third conductive member.

19. The voltage regulator module according to claim 11, wherein the switch circuit assembly further comprises an input capacitor electrically connected with respective input terminals of the two switch circuits.

20. The voltage regulator module according to claim 11, wherein the conductor assembly comprises at least one positive output terminal conductor, electrically connected with the at least one first conductive member, and an area of the at least one positive output terminal conductor is larger than or equal to a surface area of the at least one first conductive member.

21. The voltage regulator module according to claim 11, wherein the switch circuit comprises a first switch and a second switch, and the first switch is electrically connected with the second switch in series.

22. The voltage regulator module according to claim 11, wherein the magnetic assembly further comprises two second conductive members, and one end of each of the two conductive members receives a pulse width modulation signal, wherein a phase difference between the pulse width modulation signal received by one of the two second conductive members and the pulse width modulation signal received by the other of the two second conductive members is 180 degree, and the switch circuit connected with the corresponding second conductive member is controlled according to the pulse width modulation signal received by the corresponding second conductive member.

\* \* \* \* \*